United States Patent
Engel et al.

(10) Patent No.: US 12,401,371 B2
(45) Date of Patent: Aug. 26, 2025

(54) CALIBRATION OF DIGITAL-TO-ANALOG CONVERTERS

(71) Applicant: Analog Devices, Inc., Wilmington, MA (US)

(72) Inventors: Gil Engel, Lexington, MA (US); Paul S. Wilkins, Weston, MA (US)

(73) Assignee: Analog Devices, Inc., Wilmington, MA (US)

( * ) Notice: Subject to any disclaimer, the term of this patent is extended or adjusted under 35 U.S.C. 154(b) by 233 days.

(21) Appl. No.: 18/171,197

(22) Filed: Feb. 17, 2023

(65) Prior Publication Data
US 2023/0275596 A1  Aug. 31, 2023

Related U.S. Application Data (60) Provisional application No. 63/314,614, filed on Feb. 28, 2022.

(51) Int. Cl.
*H03M 1/10* (2006.01)

(52) U.S. Cl.
CPC .................. *H03M 1/1009* (2013.01)

(58) Field of Classification Search
CPC .... H03M 1/1009; H03M 1/1004; H03M 1/66; H03M 1/1095; H03M 1/1023; H03M 1/661
USPC .................................................. 341/120, 144
See application file for complete search history.

(56) References Cited

U.S. PATENT DOCUMENTS

| | | | |
|---|---|---|---|
| 6,130,632 | A | 10/2000 | Opris |
| 6,667,703 | B1 | 12/2003 | Reuveni et al. |
| 6,919,833 | B2 | 7/2005 | Mills |
| 7,148,828 | B2 | 12/2006 | Fernandez et al. |
| 7,161,412 | B1 | 1/2007 | Manganaro |
| 7,394,414 | B2 | 7/2008 | Briaire |
| 8,125,361 | B2 | 2/2012 | Choe et al. |
| 8,269,480 | B2 | 9/2012 | Max et al. |
| 8,378,865 | B2 | 2/2013 | Zhang |
| 9,577,657 | B1 | 2/2017 | Clara |
| 2006/0158360 | A1 | 7/2006 | Briaire |

(Continued)

FOREIGN PATENT DOCUMENTS

| | | |
|---|---|---|
| EP | 3242404 B1 | 7/2022 |
| EP | 4072022 A1 | 10/2022 |

(Continued)

OTHER PUBLICATIONS

"U.S. Appl. No. 15/144,163, 312 Amendment filed Sep. 9, 2016", 11 pgs.

(Continued)

*Primary Examiner* — Jean B Jeanglaude
(74) *Attorney, Agent, or Firm* — Schwegman Lundberg & Woessner, P.A.

(57) ABSTRACT

Techniques that enable calibration of digital-to-analog Converters (DACs) with minimal processing overhead. A single frequency bin can be used to calibrate errors between bits. A low frequency feedback path can be included into a low frequency low power ADC to determine the error signal that exists in the calibration bin. The bits are calibrated when this error signal is minimized. The calibration techniques described provide an extremely efficient and optimal calibration at the DAC output of both static and dynamic errors.

20 Claims, 5 Drawing Sheets

(56) References Cited

U.S. PATENT DOCUMENTS

| | | |
|---|---|---|
| 2006/0197688 A1 | 9/2006 | Chan |
| 2010/0164762 A1 | 7/2010 | Datta et al. |
| 2013/0234871 A1 | 9/2013 | Eliezer et al. |
| 2015/0288380 A1* | 10/2015 | Zhao ........................ H03M 3/37 341/120 |
| 2021/0194492 A1 | 6/2021 | Zhao et al. |

FOREIGN PATENT DOCUMENTS

| | | |
|---|---|---|
| EP | 4072022 B1 | 5/2025 |
| TW | I884425 B | 5/2025 |

OTHER PUBLICATIONS

"U.S. Appl. No. 15/144,163, Notice of Allowance mailed Jul. 7, 2016", 9 pgs.

"U.S. Appl. No. 15/144,163, Notice of Allowance mailed Oct. 11, 2016", 12 pgs.

"European Application Serial No. 22174946.8, Extended European Search Report mailed Sep. 12, 2022", 9 pgs.

Bechthum, Elbert, et al., "Timing error measurement for highly linear wideband Digital to Analog Converters", Circuits And Systems (ISCAS), 2011 IEEE International Symposium On, IEEE, (May 15, 2011), 2019-2022.

Bock, De Maarten, et al., "Calibration of DAC Mismatch Errors in S? ADCs Based on a Sine-Wave Measurement", IEEE Transactions on Circuits and Systems—II: Express Briefs, vol. 60, No. 9, (Sep. 2013), 5 pgs.

Cong, Yonghua, et al., "A 1.5-V 14-Bit 100-MS/s Self-Calibrated DAC", 2003 IEEE Journal of Solid-State Circuits, vol. 38, No. 12, 10 pgs.

Dong, Qiu, et al., "A Current-Steering Self-Calibration 14-bit 100-MSPs DAC", 2010 Chinese Institute of Electronics, Journal of Semiconductors, vol. 31, No. 12, (Dec. 2010), 5 pgs.

Georgi, Ivanov Radulov, "Flexible and Self-Calibrating Current-Steering Digital-to-Analog Converters: Analysis, Classification and Design", Eindoven University of Technology Library, (Jan. 14, 2010,), 290 pgs.

Jankunas, Benjamin, "Design and Calibration of a 12-Bit Current-Steering DAC Using Data-Interleaving", Thesis, Arizona State University, December, (2014), 71 pgs.

Nagahara, Masaaki, et al., "Frequency Domain Min-Max Optimization of Noise-Shaping Delta-Sigma Modulators", IEEE Transactions on Signal Processing, vol. 60, No. 6, (Jun. 2012), 12 pgs.

Nguyen, Khiem, et al., "A 108 dB SNR, 1.1 mW Oversampling Audio DAC With A Three-Level OEM Technique", IEEE Journal of Solid-State Circuits, vol. 43, No. 12, (Dec. 2008), 9 pgs.

Radulov, G. I, et al., "A Self-Calibrating Current-Steering 12-Bit DAC Based on New 1-Bit Self-Test Scheme", IEEE IC Test Workshop, Limerick, Ireland, (Sep. 13-14, 2004), 6 pgs.

Tang, Yongjian, et al., "A 14 bit 200 MS/s DAC with SFDR> 78 dBc, IM3<-83 dBc and NSD<-163 dBm/Hz across the whole nyquist band enabled by dynamic-mismatch mapping", IEEE Journal of Solid-State Circuits 46.6, (2011), 1371-1381.

Van De Vel, Hans, et al., "A 240mW 16b 3.2GS/s DAC in 65nm CMOS with, -80dBc 1M3 up to 600 Mhz", ISSCC 2014, Session 11, Data Conversion Techniques, 11.7, 2014 IEEE Solid-State Circuits Conference, (2014), 3 pgs.

Yang, Dayn, et al., "Built-In Self-Test for Automatic Analog Frequency Response Measurement", Dept. of Electrical and Computer Engineering, Auburn University, AL, USA, Proc. IEEE International Symp. on Circuits and Systems, (2005), 2208-2211.

Zeng, Tao, et al., "Static and Dynamic Nonlinearity Compensation Techniques for High Performance Current-Steering Digital-to-Analog Converters", a Thesis, Iowa State University, Digital Repository@Iowa State University, (2010), 67 pgs.

"European Application Serial No. 16191925.3, Communication Pursuant to Article 94(3) EPC mailed Nov. 19, 2019", 6 pgs.

"European Application Serial No. 16191925.3, Extended Search Report mailed Oct. 2, 2027", 12 pgs.

"European Application Serial No. 16191925.3, Intention to Grant mailed Feb. 22, 2022", 46 pgs.

"European Application Serial No. 16191925.3, Response filed Feb. 27, 2020 to Communication Pursuant to Article 94(3) EPC mailed Nov. 19, 2019", 11 pgs.

"European Application Serial No. 16191925.3, Response filed May 1, 2018 to Extended European Search Report mailed Oct. 2, 2027", 26 pgs.

"European Application Serial No. 16191925.3, Response filed Oct. 25, 2021 to Summons to Attend Oral Proceedings mailed Jul. 20, 2021", 19 pgs.

"European Application Serial No. 16191925.3, Summons to Attend Oral Proceedings mailed Jul. 20, 2021", 13 pgs.

"European Application Serial No. 23158077.0, Extended European Search Report mailed Sep. 8, 2023", 9 pgs.

"European Application Serial No. 23158077.0, Response filed Mar. 29, 2024 to Extended European Search Report mailed Sep. 8, 2023", 16 pgs.

"Japanese Application Serial No. 2023-30239, Voluntary Amendment filed Aug. 5, 2024", w/ English claims, 10 pgs.

"Korean Application Serial No. 10-2023-0024619, Notice of Preliminary Rejection mailed Mar. 18, 2025", w/o English translation, 4 pgs.

"Korean Application Serial No. 10-2023-0024619, Response filed May 9, 2025 to Notice of Preliminary Rejection mailed Mar. 18, 2025", w/ English Claims, 32 pgs.

"Taiwanese Application Serial No. 112106921, Office Action mailed Mar. 5, 2024", w/ English machine translation, 26 pgs.

"Taiwanese Application Serial No. 112106921, Office Action mailed Aug. 27, 2024", w/ English machine translation, 10 pgs.

"Taiwanese Application Serial No. 112106921, Response filed May 27, 2024 to Office Action mailed Mar. 5, 2024", w/English English Claims, 63 pgs.

"Taiwanese Application Serial No. 112106921, Response filed to Office Action mailed Aug. 27, 2024", w/English claims, 62 pgs.

"Taiwanese Applicarion Serial No. 112106921, Voluntary Amendment filed Apr. 19, 2023", w/ English Claims, 208 pgs.

Catteau, B., et al., "A Digital Calibration Technique for the Correction of Glitches in High-Speed DAC's", Circuits and Systems, 2007. ISCAS 2007. IEEE International Symposium 0 N, IEEE PI (May 1, 2007), 1477-1480.

Doris, K, et al., "Mismatched-based timing errors in current steering DACs", Proceedings of the 2003 International Symposium on Circuits and Systems, 2003. ISCAS 2003,val. I, (May 28, 2003), 977-980.

Hassan, IHS, et al., "Testing digital to analog converters based on oscillation-test strategy using sigma-delta modulation", Computer Design: VLSI in Computers and Processors. 1998. CCD '98. Proceedings. Internatonal Conference on Austin. TX., (Oct. 5, 1998), 40-46.

Tang, Yongjian, et al., "A 14 bit 200 MS/s DAC With SFDR78 dBc, IM-83 dBc and NSD-163 dBm/Hz Across the Whole Nyquist Band Enables by Dynamic-Mismatch Mapping", IEEE Journal of Solid-State Circuits, IEEE, USA, vol. 46, No. 6, 1371-1381, (Jun. 1, 2011), 12 pgs.

Tang, Yongjian, "Predictive timing error calibration technique for RF current-steering DACs", Circuits and Systems, 2008, ISCAS 2008. IEEE International Symposium ON, IEEE, (May 18, 2008), 228-231.

* cited by examiner

CALIBRATION OF DIGITAL-TO-ANALOG CONVERTERS

CLAIM OF PRIORITY

This application claims the benefit of priority of U.S. Provisional Patent Application Ser. No. 63/314,614, titled "BACKGROUND CALIBRATION OF DIGITAL-TO-ANALOG CONVERTERS" to Gil Engel et al., filed on Feb. 28, 2022, the entire contents of which being incorporated herein by reference.

BACKGROUND

Integrated circuits process electrical signals for rich electronic applications. Data converters are an important part of electronics, responsible for converting signals between the digital domain and the analog domain. However, circuits inside data converters or circuits driving the data converters are not perfect, and as a result, the conversion output may not be perfect. The imperfections or non-idealities can cause unwanted noise or spurs to appear at the output and degrade the performance of the data converter. If not removed or calibrated out, the noise or spurs can even affect other parts of the signal chain.

SUMMARY OF THE DISCLOSURE

This disclosure describes various techniques that enable calibration, e.g., background calibration or foreground calibration, of digital-to-analog Converters (DACs) with minimal processing overhead. A single frequency bin can be used to calibrate errors between bits. A low frequency feedback path can be included into a low frequency low power ADC to determine the error signal that exists in the calibration bin. The bits are calibrated when this error signal is minimized. The calibration techniques described provide an extremely efficient and optimal calibration at the DAC output of both static and dynamic errors.

In some aspects, this disclosure is directed to a method for measuring non-idealities of a DAC having a plurality of DAC cells and a plurality of redundant DAC cells whose outputs are summed to generate an analog output of the DAC, the method comprising: providing digital data to the DAC cells to generate an output spectrum at the analog output of the DAC; generating a first digitally-encoded calibration stimulus having a first fundamental energy at a first frequency bin; scaling the first digitally-encoded calibration stimulus by a first weighting factor, and providing a first weighted calibration stimulus to a first subset of the redundant DAC cells to generate a first analog tone while the DAC cells generate the output spectrum; scaling the first digitally-encoded calibration stimulus by a second weighting factor, and providing a second weighted calibration stimulus to a second subset of the redundant DAC cells to generate a second analog tone while the DAC cells generate the output spectrum, wherein the second weighting factor is selected to cause the first analog tone and the second analog tone to have opposite polarities; detecting, in the analog output of the DAC, an error tone at the first frequency bin resulting from the first analog tone and the second analog tone.

In some aspects, this disclosure is directed to a method for measuring non-idealities of a DAC having a plurality of DAC cells and a plurality of redundant DAC cells whose outputs are summed to generate an analog output of the DAC, the method comprising: generating a first digitally-encoded calibration stimulus having a first fundamental energy at a first frequency bin; scaling the first digitally-encoded calibration stimulus by a first weighting factor to generate a first weighted calibration stimulus; providing the first weighted calibration stimulus to the redundant DAC cells to generate a first analog tone; providing digital data and an inverted version of the first weighted calibration stimulus to the DAC cells to generate an output spectrum and a second analog tone, while the first weighted calibration stimulus is provided to the redundant DAC cells; and detecting, in the analog output of the DAC, an error tone resulting from the first analog tone and the second analog tone.

In some aspects, this disclosure is directed to a method for measuring one or both of static errors between DAC cells and timing errors between DAC cells of a multi-gigabit per second DAC having a plurality of DAC cells and a plurality of redundant DAC cells whose outputs are summed to generate an analog output of the DAC, the method comprising: providing digital data to the DAC cells to generate an output spectrum at the analog output of the DAC; generating a first digitally-encoded calibration stimulus having a first fundamental energy at a first frequency bin; scaling the first digitally-encoded calibration stimulus by a first weighting factor, and providing a first weighted calibration stimulus to a first subset of the redundant DAC cells to generate a first analog tone while the DAC cells generate the output spectrum; scaling the first digitally-encoded calibration stimulus by a second weighting factor, and providing a second weighted calibration stimulus to a second subset of the redundant DAC cells to generate a second analog tone while the DAC cells generate the output spectrum, wherein the second weighting factor is selected to cause the first analog tone and the second analog tone to have opposite polarities, wherein summing the first analog tone and the second analog tone yields the error tone; and detecting, in the analog output of the DAC, an error tone at the first frequency bin resulting from the first analog tone and the second analog tone by detecting energy in the analog output of the DAC at the first frequency bin.

In some aspects, this disclosure is directed to a digital-to-analog converter (DAC) having calibration, comprising: a plurality of DAC cells to receive digital data and generate an output spectrum; a stimulus generator to generate a first digitally-encoded calibration stimulus having a first fundamental energy at a first frequency bin; one or more reference DAC cells to receive a weighted version of the first digitally-encoded calibration stimulus to generate a first analog tone; one or more calibration DAC cells to receive a further weighted version of the first digitally-encoded calibration stimulus to generate a second analog tone, wherein the second analog tone is of opposite polarity to the first analog tone; wherein outputs of the DAC cells, the reference DAC cells, and the calibration DAC cells are summed to form an analog output of the DAC; a sense ADC at the analog output of the DAC to sense an error tone resulting from the first analog tone and the second analog tone.

In some aspects, this disclosure is directed to a digital-to-analog converter (DAC) having calibration, comprising: a stimulus generator to generate a first digitally-encoded calibration stimulus having a first fundamental energy at a first frequency bin; a plurality of DAC cells to receive digital data and a weighted version of the first digitally-encoded calibration stimulus, and to generate an output spectrum and a first analog tone at an analog output of the DAC; one or more calibration DAC cells to receive a further weighted version of the first digitally-encoded calibration stimulus to generate a second analog tone, wherein the second analog tone is of opposite polarity to the first analog tone; wherein outputs of the DAC cells and the calibration DAC cells are summed to form an analog output of the DAC; and a sense ADC at the analog output of the DAC to sense an error tone resulting from the first analog tone and the second analog tone.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

A DAC maps a digital word to an analog output. The DAC bits may have amplitude and timing errors. These errors (or sometimes referred herein as "non-idealities") result in distortion and degradation of the dynamic range in DACs. Background calibration of static and dynamic errors, and a flexible approach to generating test patterns as the stimulus are described.

Basics of DACs

Real-world analog signals such as temperature, pressure, sound, or images are routinely converted to a digital representation that can be easily processed in modern digital systems. In many systems, this digital information must be converted back to an analog form to perform some real-world function. The circuits that perform this step are DACs, and their outputs may be used to drive a variety of devices. Loudspeakers, video displays, motors, mechanical servos, radio frequency (RF) transmitters, and temperature controls are just a few diverse examples.

A DAC is a circuit, device, or system that produces a quantized (discrete step) analog output in response to a digital input code. The digital input is generated in the digital domain, e.g., from transistor logic (TTL), emitter-coupled logic (ECL), complementary metal-oxide-semiconductor (CMOS) circuits, or low-voltage differential signaling (LVDS), digital logic, a processor, etc. The DAC converts the digital input into an analog output. The analog output of the DAC may be either a voltage or a current. In some cases, the digital input can include binary coded bits, or thermometer coded bits. Bits of the digital input are provided to drive or control circuits in the DAC to generate the analog output.

To generate the output, a reference quantity is divided into binary and/or linear fractions. One or more DAC cells are implemented for each one of those fractions. The digital input drives switches to individual DAC cells having appropriate weights corresponding to those fractions. Respective parts of the digital input drives respective DAC cells to deliver an aggregate output of the DAC cells that is representative of the digital input. DAC cells can include current sources, voltage sources, resistors, capacitors, etc. The DAC cells can be actuated by the digital input, i.e., digital input code, to generate the analog output. In some embodiments, the outputs of the DAC cells are summed or combined to generate the aggregate output.

In some cases, a segmented DAC can use different circuit architectures and/or coding for different segments of the digital input. Segmented architectures, where the full resolution of the converter is spread across two or more sub-DACs, can be used for both current- and voltage-output DACs. The sub-DACs of the overall DAC need not have the same resolution. In some cases, redundant circuits can also be provided in the DAC where additional circuitry or DAC cells are included in the design.

Figure 1:
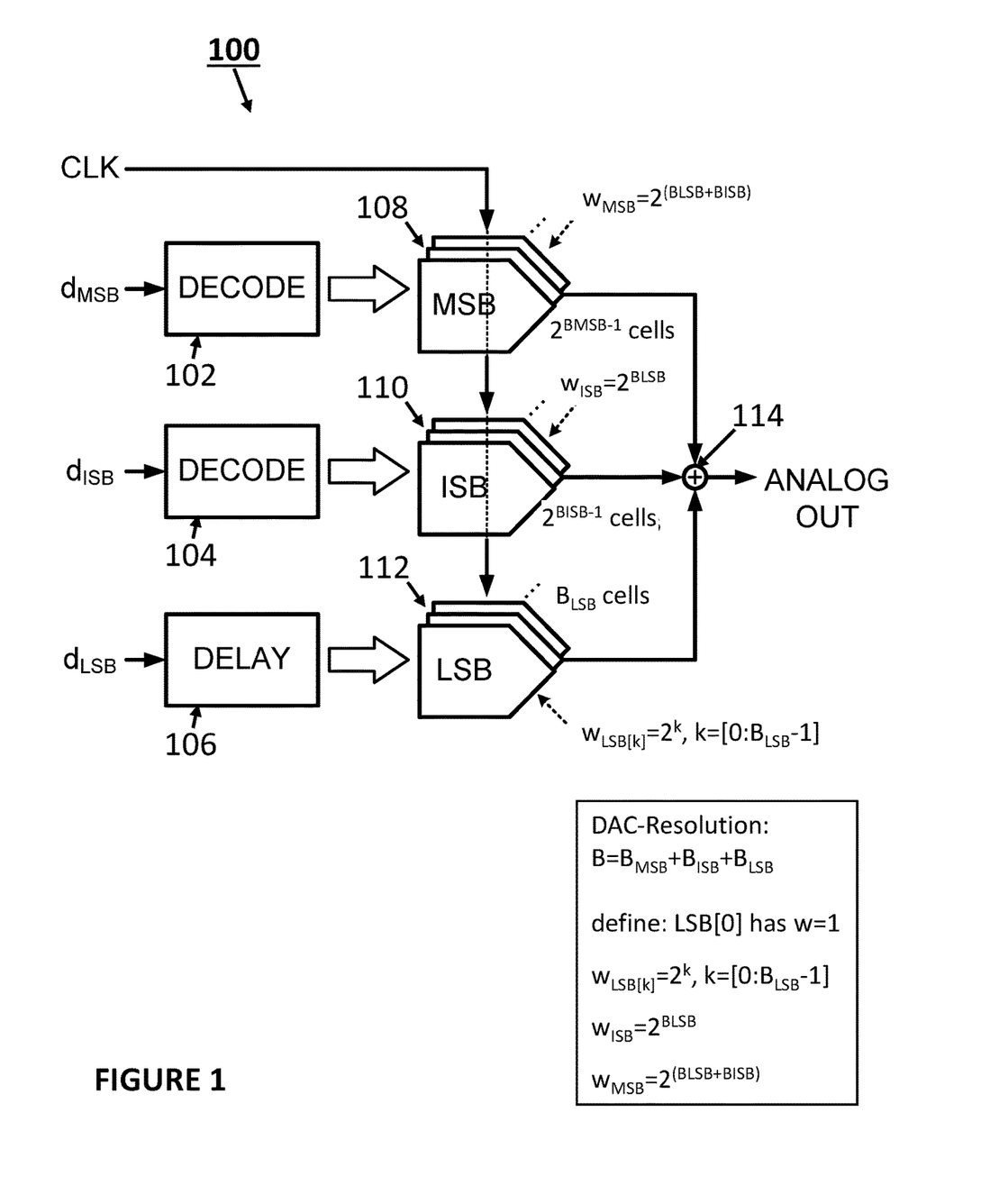
FIG. 1 is an exemplary segmented digital-to-analog converter (DAC), according to some embodiments of the disclosure.

FIG. 1 illustrates an exemplary segmented DAC 100, according to some embodiments of the disclosure. As shown in FIG. 1, a digital input signal or digital input code can be is provided to a segmentation unit that separates the digital input signal/code into its most significant bits $d_{MSB}$, intermediate significant bits $d_{ISB}$, and least significant bits $d_{LSB}$. Most significant bits $d_{MSB}$ can be provided to decoder block 102. Intermediate significant bits dis can be provided to decoder block 104. Decoder block 102 and decoder block 104 can decode the most significant bits $d_{MSB}$ and the intermediate significant bits $d_{ISB}$ from binary coding to thermometer coding, so that unary DAC cells (i.e., DAC cells having the same bit weight) for the MSB segment and the ISB segments can convert the most significant bits $d_{MSB}$ and the intermediate significant bits $d_{ISB}$ into respective analog outputs of the MSB and ISB segments. Least significant bits $d_{LSB}$ can be provided to delay block 106 (to provide or mimic delay of the decoder blocks 102 and 104). Binary weighted DAC cells can convert the least significant bits $d_{LSB}$ into an analog output of the LSB segment. Suppose the full resolution of the segmented DAC 100 is $B=B_{MSB}+B_{ISB}+B_{LSB}$, and there are $B_{MSB}$ number of bits for the most significant bit segment, $B_{ISB}$ number of bits for the intermediate significant bits, $B_{LSB}$ number of bits for the least significant bits. Unary DAC cells 108 for the most significant bits segment can include at least $2^{BMSB-1}$ DAC cells, which all have the same (ideal) bit weight $w_{MSB}=2^{(BLSB+BISB)}$. Unary DAC cells 110 for the intermediate significant bits segment can include at least $2^{BISB-1}$ DAC cells, which all have the same (ideal) bit weight $w_{ISB}=2^{BLSB}$. Binary DAC cells 112 can have $B_{LSB}$ DAC cells, which have different binary bit weights $w_{LSB[k]}=2^k$, $k=[0:B_{LSB}-1]$. The different segments generate a respective analog output based on the respective digital input to the different segments. A combiner 114 combines, sums, or adds respective outputs of the segments having DAC cells (e.g., segments having unary DAC cells 108, unary DAC cells 110 or binary DAC cells 112) to generate an analog output of the overall DAC 100.

In some cases, the decoder blocks 102 and 104 (either one or both) can implement additional logic to shuffle the unary DAC cells 108 and 110 to average out mismatches between cells to reduce distortion at the analog output.

Segmented DACs such as the one shown in FIG. 1 finds a balance between accuracy and design complexity of a converter. One benefit of segmentation is that of reducing the number of resistors (or current sources) required to achieve a given resolution by allowing different DAC architectures to be used for different segments of the digital input code, thereby allowing smaller die sizes. Thus, it is common for high-resolution DACs to be segmented. To achieve high speeds, current-steering DAC cells are typically used.

Errors in DACs

Segmented DACs or DACs in general are not perfect, and calibrating the unary or binary DAC cells can pose a challenge to designers. As with many other devices fabricated using complicated manufacturing processes, various imperfections/non-idealities can affect the performance of DACs.

One example includes imperfections of the circuits affecting performance of individual elements of a DAC (referred to herein as a "DAC cell"). The imperfections can be due to manufacturing variations, typically referred to as a "static mismatch" or "DC errors". For instance, static mismatches can be caused by sizes of devices, e.g., resistors, current sources, transistors, being different from ideal sizes. As a result, the "bit weight" of a DAC cell may be off from the ideal value, resulting in an "amplitude error".

Another example includes timing errors, typically referred to as "AC errors" (AC stands for alternating current) or "dynamic errors", which can be caused by, e.g., clock jitter, switch mismatch, and driver mismatch. Timing errors can be global (e.g., associated with the global clock signal), or they can be local to a particular DAC cell. Timing errors can result in a "wrong" amount of "bit weight" being delivered to the analog output when transitions in the analog output of a DAC cell occurs earlier than or delayed from the ideal time, or the transition deviates from an ideal transition. In some cases, clock jitter can affect when a particular DAC cell is turned on with respect to reference DAC cell (i.e., two DAC cells are not turned on at the same time when it is expected to turn on at the same time). In these scenarios, a DAC cell is turned on and off earlier or later than the ideal time, resulting in an error in the analog output. In some cases, a DAC cell itself can have transition asymmetry, where the rising and falling of the analog output behaves differently. For example, transition asymmetry due to switch mismatch e.g., mismatch in a pair of differential switches responsible for steering a current towards a particular one of the outputs, can affect performance of a particular DAC cell, causing the rising and falling transitions to behave differently. In another example, transition asymmetry due to driver mismatch, e.g., timing mismatch in signal paths driving a pair of differential switches responsible for steering a current towards a particular one of the outputs, can also affect performance of a particular DAC cell, again causing the rising and falling transitions to deviate from the ideal. These timing-related imperfections can also lead to duty cycle error, where the period of a DAC cell being "on" is different from an ideal period (e.g., too long or too short when compared with respect to a reference or ideal period).

Another example includes drifts, e.g. thermal drift, aging, etc., which changes the characteristics of the device over time and making the device deviate from the ideal.

Many of these examples mentioned above results in distortions at the analog output, thus affecting the performance of the overall DAC. For some errors, designers have opted to use bigger devices to reduce some of the errors. However, increasing device sizes and thus increasing area and power consumption is not always desirable. Rather than trying to increase devices, designers have dealt with the performance issues through calibration.

Downsides of Certain Calibration Techniques

Various schemes have been proposed to measure and calibrate for errors in the DAC. For instance, square wave of a particular frequency and an inverted version of such square wave can be used as calibration stimulus to control (1) a reference DAC cell and (2) a calibration DAC cell (and more calibration cell(s) if a desired weight is to be achieved to balance the reference DAC cell), and the analog output can be measured to determine timing skew. However, such approach can be limited, and may not be practical for some applications. One reason that square waves as the calibration stimulus is undesirable is that square waves generate even harmonics at the output of the DAC. Such even harmonics and/or its images can affect the actual signal that the DAC is generating, and can severely degrade the performance of the DAC if the square wave is applied in the background (i.e., during normal operation of the DAC).

In some techniques, an uncorrelated pseudo-random sequence is used as a calibration stimulus to a reference DAC cell and a calibration DAC cell. While such a sequence does not generate tones at the output, a broadband observation analog-to-digital converter (ADC) would be needed to observe the analog output of the DAC and the digital processing to extract errors exposed using this stimulus is too computationally intensive to be practical.

In some techniques, delta-sigma patterns can be generated as the calibration stimulus. A delta-sigma converter can be used to generate the pattern. Delta-sigma modulators can desirably push noise out of the frequency range of interest. The calibration techniques of this disclosure are not limited to use with delta-sigma patterns or delta-sigma modulators, however. In other examples, square wave or other patterns can be used.

Extracting Errors in the Background

To calibrate either static or dynamic errors within a DAC in the background, one or more reference bits (e.g., one or more reference DAC cells) can be stimulated with a pattern (or stimulus) to produce a reference tone at the analog output of a DAC. Each reference DAC cell would receive the same pattern. The same pattern can be applied to one or more calibration bits (e.g., one or more calibration DAC cells) to generate a calibration tone having an opposite polarity to the reference tone.

The goal is to generate a reference tone and a calibration tone that can cancel each other out if there are no mismatches between the reference bits and the calibration bits. One of the patterns being applied can be inverted (e.g., scaled by a negative quantity). One or more patterns can be weighted to ensure the magnitudes of the reference tone and the calibration tone are ideally the same. Each calibration DAC cell would receive the same pattern.

The reference tone and the calibration tone are intended to have the same magnitude but of opposite polarity, if the reference DAC cell(s) and the calibration DAC cell(s) match each other (or do not have errors relative to each other). If there are mismatches, then an error tone results, and the error tone can be observed to compensate/correct the mismatches. Depending on the bit weights of the reference DAC cell(s) and the bit weights of the calibration DAC cell(s), the pattern may be weighted accordingly to generate the reference tone and the calibration tone to have similar magnitude.

Note that in parallel, normal DAC cells are operating to convert digital data into a desired analog output spectrum (as in normal operation), and the reference DAC cells and the calibration DAC cells are redundant DAC cells of the DAC receiving the patterns simultaneously with the normal DAC cells. It is common to have redundant DAC cells in DAC architectures, and/or a bank of (redundant) DAC cells that can produce an attenuated output. In many applications, the calibration technique occurs during normal operation of the DAC and the error tone does not impact the DAC significantly. Ability to perform the calibration technique in the background is due to the very small signal amplitude of the error tone.

Once the outputs of the DAC cells are summed, the analog output of the DAC has an error tone resulting from the reference tone and the calibration tone being summed. The error tone would correspond to the difference error between the one or more reference bits and the one or more calibration bits. Since the reference tone, the calibration tone, and thus the error tone as well all occupy a single frequency bin, processing/examining the energy at the single frequency bin can extract the difference/mismatch error.

In some cases, a least means squared or binary search algorithm can be used to modify the DAC iteratively (in the digital domain or the analog domain) to minimize the amplitude of the error tone. The algorithm can thus drive the difference/mismatch error to be smaller and smaller.

For exposing static errors, the pattern preferably causes DAC cells to generate a tone that has a fundamental energy at or near DC (or zero frequency). For exposing dynamic errors, the pattern preferably causes DAC cells to generate a tone that has a fundamental energy at or near Nyquist.

The pattern does not need to be a delta-sigma generated pattern because it may not be practical to provide a stimulus generator that includes a delta-sigma converter having a feedback loop. Rather, the pattern can be a 1-bit sequence that approximates a sinewave, such that DAC cell(s) stimulated by the 1-bit sequence would output a tone that has a fundamental energy at a signal frequency bin. The components of the error tone not associated with the fundamental tone are even lower than the fundamental energy.

As the calibration progresses, the error tone becomes smaller and smaller, thereby decreasing the error tone's impact on the normal operation of the DAC.

Figure 2:
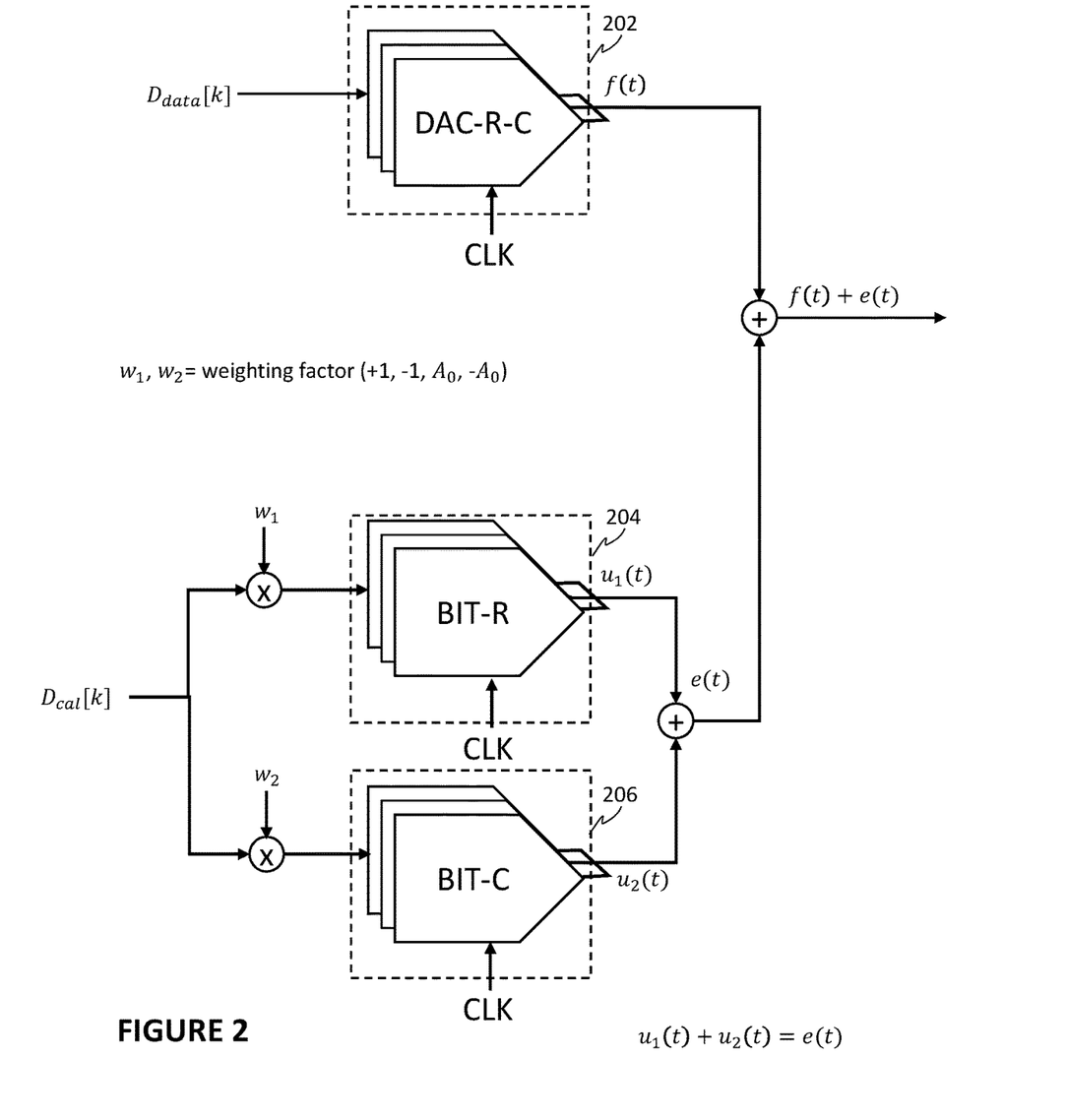
FIG. 2 is an exemplary DAC having background calibration using reference DAC cell(s) and calibration DAC cell(s), according to some embodiments of the disclosure.

Exemplary DAC with Background Calibration Using Redundant DAC Cells as Reference DAC Cells and Calibration DAC Cells FIG. 2 is an exemplary DAC having background calibration using reference DAC cell(s) and calibration DAC cell(s), according to some embodiments of the disclosure. The DAC has (normal or main) DAC cells 202, and redundant DAC cells. Redundant DAC cells are not used to generate a desired output spectrum (e.g., for a specified period of time). It is possible that the same cells can be used to generate a desired output spectrum at a different point in time, and some cells in the DAC cells 202 become redundant DAC cells at that point in time (e.g., roles are swapped or rotated). A subset of the redundant DAC cells is labeled as reference DAC cell(s) 204, and another subset of the redundant DAC cells is labeled as calibration DAC cell(s) 206. Outputs of the DAC cells of the DAC are summed to form a final analog output.

The normal DAC cells 202 receive digital data $D_{data}[k]$ and are operating normally to generate a desired output spectrum f(t). Digital data $D_{data}[k]$ and/or $D_{data}[k]$ may be shuffled to implement dynamic element matching such that mismatches in DAC cells 202 are averaged.

A calibration stimulus $D_{cal}[k]$ is generated for the calibration. The calibration stimulus can be scaled by a first weighting factor $w_1$ before it is provided to each reference DAC cell(s) 204. The calibration stimulus causes a first analog tone $u_1$ (t) to be generated by reference DAC cell(s) 204. The calibration stimulus $D_{cal}[k]$ can be scaled by a second weighting factor $w_2$ before it is provided to each calibration DAC cell(s). The calibration stimulus causes a second analog tone $u_2$ (t) to be generated by the calibration DAC cell(s) 206.

The (weighted) calibration stimulus is applied to the reference DAC cell(s) 204 and the calibration DAC cell(s) 206 in the background while the digital data is applied to the normal DAC cells 202.

A suitable number of reference DAC cell(s) 204 and a suitable number of calibration DAC cell(s) 206 can be selected to receive the calibration stimulus. The first weighting factor $w_1$ and the second weighting factor $w_2$ are selected such that the first analog tone $u_1$ (t) and the second analog tone $u_2$ (t) have substantially the same magnitude and are of opposite polarity. When the first analog tone $u_1$ (t) and the second analog tone $u_2$ (t) are summed, an error tone e (t) representing the difference between the reference DAC cell(s) 204 and the calibration DAC cell(s) 206 results.

Because the outputs of the DAC cells are summed, the analog output has the desired output spectrum and an error tone: f(t)+e(t).

Figure 3:
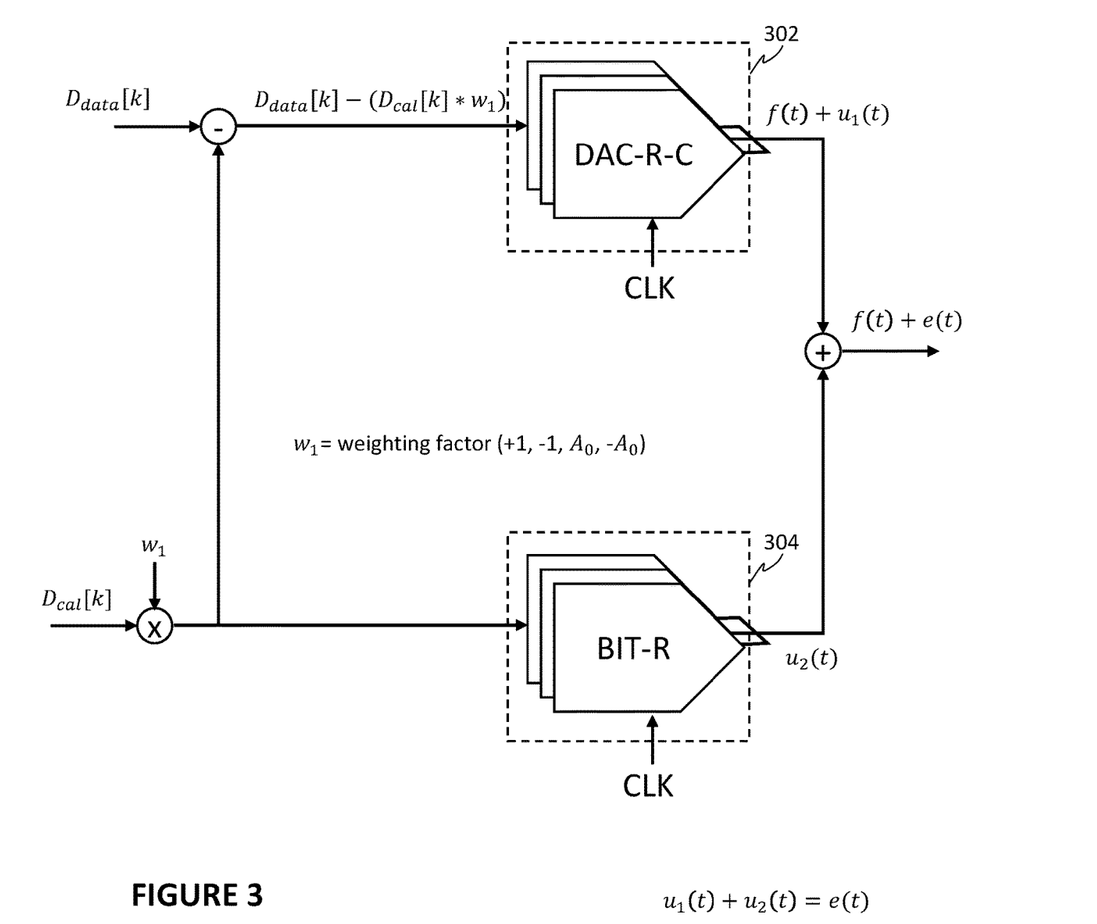
FIG. 3 is an exemplary DAC having background calibration relative to the main DAC, according to some embodiments of the disclosure

Exemplary DAC with Background Calibration Using Redundant DAC Cells as Calibration DAC Cells Rather than comparing a subset of the redundant DAC cells to each other (as illustrated in FIG. 3), one or more redundant DAC cells are compared to the normal DAC cells (i.e., the main DAC). This variation yields another background calibration technique that can be performed while the DAC is operating. One or more calibration bits can be stimulated with a calibration tone, and a same or derivation of the calibration tone can be subtracted from the main DAC output spectrum signal path. If there is no error between the calibration bit(s) and the main DAC cells, there would be no error tone present at the analog output of the DAC. One advantage of this technique is to reduce the number of redundant DAC cells needed for the calibration technique.

FIG. 3 is an exemplary DAC having background calibration relative to the main DAC, according to some embodiments of the disclosure. The DAC has (normal or main) DAC cells 302, and redundant DAC cell(s) 304. Redundant DAC cells are not used to generate a desired output spectrum. The redundant DAC cell(s) 304 are used as calibration DAC cell(s). Outputs of the DAC cells of the DAC are summed to form a final analog output.

A calibration stimulus $D_{cal}[k]$ is generated for the calibration. The calibration stimulus can be scaled by a weighting factor $w_1$ before it is provided to each calibration DAC cell(s) 304. The calibration stimulus causes an analog tone $u_2$ (t) to be generated by calibration DAC cell(s) 206.

The weighted calibration stimulus $D_{cal}[k]*w_1$ is provided to modify the digital data $D_{data}[k]$ digitally. If appropriate, the calibration stimulus may be scaled by a different weighting factor if bit weights of the calibration DAC cell(s) 304 do not match the cells in the main DAC cells 302. In the example shown, the weighted calibration stimulus $D_{cal}[k]*w_1$ is subtracted from $D_{data}[k]$. The normal DAC cells 302 receive modified digital data $D_{data}[k]-(D_{cal}[k]*w_1)$ and are operating normally to generate a desired output spectrum f(t) and a further analog tone $u_1$ (t), or f(t)+$u_1$ (t). One or more DAC cells 302 are thus used effectively as one or more reference DAC cell(s).

DAC cells 302 and/or modified digital data $D_{data}[k]-(D_{cal}[k]*w_1)$ may be shuffled to implement dynamic element matching such that mismatches in DAC cells 302 are averaged.

The calibration stimulus is applied to the calibration DAC cell(s) 304 in the background while the modified digital data $D_{data}[k]-(D_{cal}[k]*w_1)$ is applied to the normal DAC cells 302.

A suitable number of calibration DAC cell(s) 304 can be selected to receive the calibration stimulus. The weighting factor $w_1$ and possibly a further weighting factor are selected such that the first analog tone $u_1$ (t) and the second analog tone $u_2$ (t) have substantially the same magnitude and are of opposite polarity. When the first analog tone $u_1$ (t) and the second analog tone $u_2$ (t) are summed, an error tone e(t) representing the difference between the main DAC cells 302 and the calibration DAC cell(s) 304 results.

Because the outputs of the DAC cells are summed, the analog output has the desired output spectrum and an error tone: f(t)+e(t).

Figure 4:
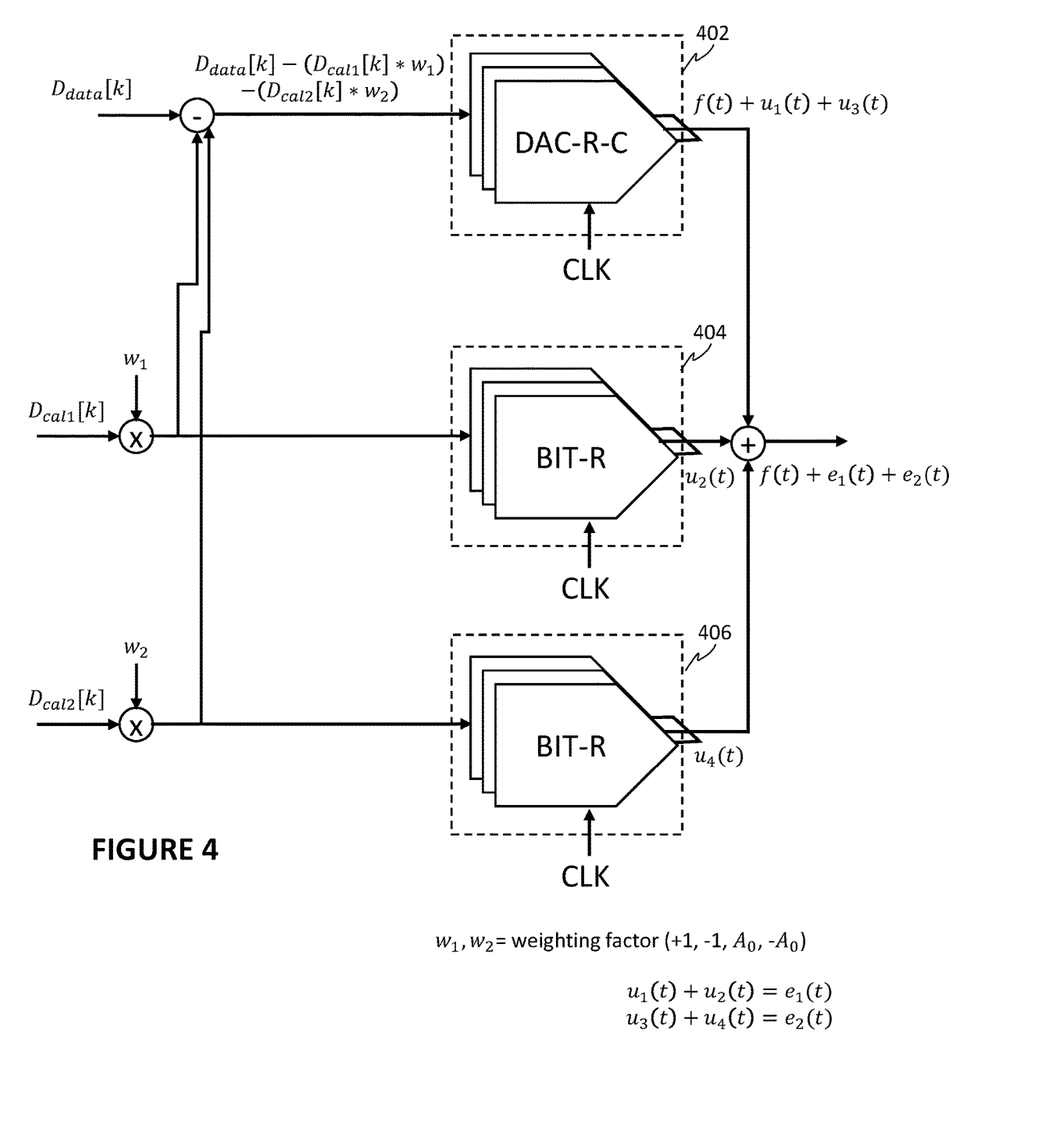
FIG. 4 is another exemplary DAC having background calibration relative to the main DAC, according to some embodiments of the disclosure.

Exemplary DAC with Multi-Tone Background Calibration Using Redundant DAC Cells as Calibration DAC Cells FIG. 4 is another exemplary DAC having background calibration relative to the main DAC, according to some embodiments of the disclosure. The DAC has (normal or main) DAC cells 402, first redundant DAC cell(s) 404 and second redundant DAC cell(s) 406. Redundant DAC cells are not used to generate a desired output spectrum. The first redundant DAC cell(s) 404 and the second redundant DAC cell(s) 406 are used as calibration DAC cell(s) to receive different calibration stimuluses having fundamental energy in different frequency bins. Outputs of the DAC cells of the DAC are summed to form a final analog output. Errors of different calibration DAC cell(s) can be extracted simultaneously A first calibration stimulus $D_{cal1}$ [k] is generated for the calibration. The first calibration stimulus $D_{cal1}$ [k] can be scaled by a weighting factor $w_1$ before it is provided to each calibration DAC cell(s) 404. The first calibration stimulus causes an analog tone $u_2$ (t) to be generated by calibration DAC cell(s) 404.

A second calibration stimulus $D_{cal2}$ [k] is generated for the calibration, where the fundamental energy is in a different frequency bin from the first calibration stimulus $D_{cal1}$ [k]. The second calibration stimulus $D_{cal2}$ [k] can be scaled by a further weighting factor $w_2$ before it is provided to each calibration DAC cell(s) 406. The second calibration stimulus causes a further analog tone $u_4$ (t) to be generated by calibration DAC cell(s) 406.

The first weighted calibration stimulus $D_{cal1}$ [k]*$w_1$ and the second weighted calibration stimulus $D_{cal2}$ [k]*$w_2$ are provided to modify the digital data $D_{data}[k]$ digitally. If appropriate, the respective calibration stimuluses may be scaled by a different weighting factor if bit weights of the calibration DAC cell(s) 404/406 do not match the cells in the main DAC cells 402. In the example shown, the first weighted calibration stimulus $D_{cal1}$ [k]*$w_1$ and the second weighted calibration stimulus $D_{cal2}$ [k]*$w_2$ are subtracted from $D_{data}[k]$. The normal DAC cells 402 receive modified digital data $D_{data}[k]-(D_{cal1}$ [k]*$w_1)-(D_{cal2}$ [k]*$w_2)$ and are operating normally to generate a desired output spectrum f(t), an analog tone $u_1$(t), and a further analog tone $u_3$ (t) or f(t)+$u_1$ (t)+$u_3$ (t). One or more DAC cells 402 are thus used effectively as one or more reference DAC cell(s).

DAC cells 402 and/or modified digital data $D_{data}[k]-(D_{cal1}$ [k]*$w_1)-(D_{cal2}$ [k]*$w_2)$ may be shuffled to implement dynamic element matching such that mismatches in DAC cells 402 are averaged.

The first calibration stimulus is applied to the calibration DAC cell(s) 404, and the second calibration stimulus is applied to the calibration DAC cell(s) 406 in the background while the modified digital data $D_{data}[k]-(D_{cal1}$ [k]*$w_1)-(D_{cal2}$ [k]*$w_2)$ is applied to the normal DAC cells 402.

A suitable number of calibration DAC cell(s) 404 can be selected to receive the calibration stimulus. The weighting factor $w_1$ and possibly a further weighting factor are selected such that the analog tone $u_1$ (t) and the analog tone $u_2$ (t) have substantially the same magnitude and are of opposite polarity. When the analog tone $u_1$ (t) and the analog tone $u_2$ (t) are summed, an error tone $e_1$ (t) representing the difference between the main DAC cells 402 and the calibration DAC cell(s) 404 results.

A suitable number of calibration DAC cell(s) 406 can be selected to receive the calibration stimulus. The weighting factor $w_2$ and possibly a further weighting factor are selected such that the analog tone $u_3$ (t) and the analog tone $u_4$ (t) have substantially the same magnitude and are of opposite polarity. When the first analog tone $u_3$ (t) and the analog tone $u_4$ (t) are summed, an error tone $e_2$ (t) representing the difference between the main DAC cells 402 and the calibration DAC cell(s) 406 results.

Because the outputs of the DAC cells are summed, the analog output has the desired output spectrum and two error tones: f(t)+$e_1$ (t)+$e_2$ (t).

Exemplary DAC with Background Calibration and Correction

Figure 5:
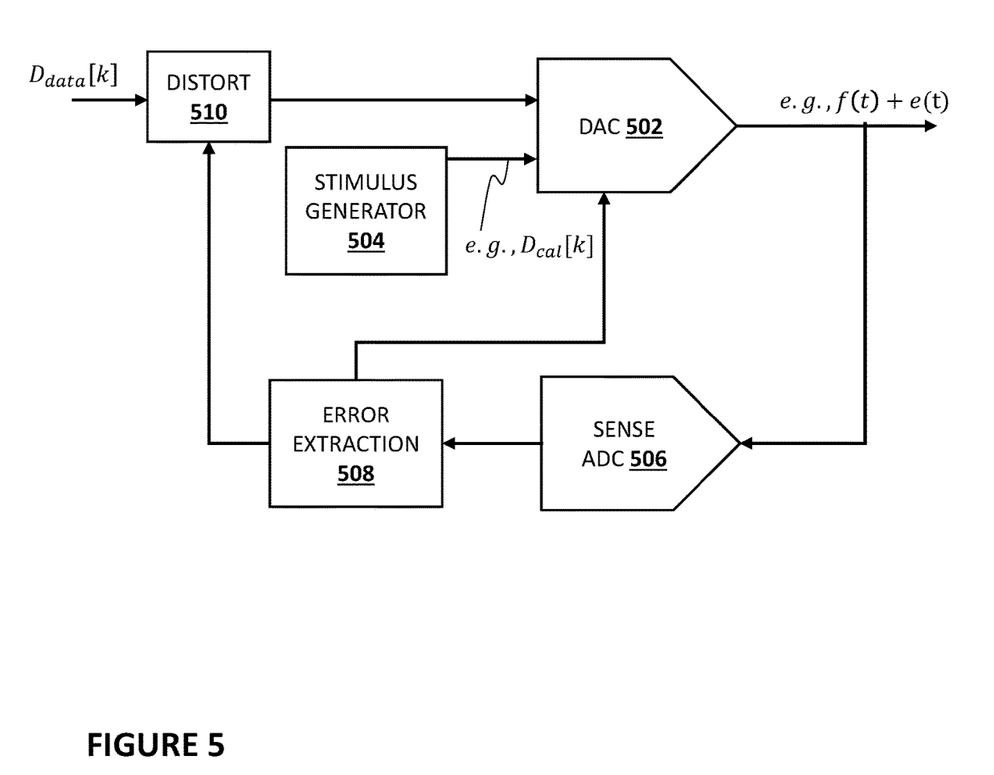
FIG. 5 is an exemplary DAC having background calibration and correction, according to some embodiments of the disclosure.

FIG. 5 is an exemplary DAC having background calibration and correction, according to some embodiments of the disclosure. The DAC 502 illustrates any one of the DACs seen in FIGS. 2-4. Further to DAC 502, a stimulus generator 504, a sense ADC 506, and error extraction logic 508 are provided. The stimulus generator 504 can generate one or more digitally-encoded calibration stimuluses as described herein. Because the error tone is in just a single frequency bin, the sense ADC 506 can be bandlimited (does not need to be a wideband ADC). Error extraction logic 508 can observe the energy in the frequency bin (which represents the error in the calibration DAC cell(s)) and perform correction to reduce the observed the energy. One way to perform correction is to distort the digital data using distortion logic 510 to compensate for the error in the digital domain. Another way to perform correction is to tune the circuitry in the DAC 502 in the analog domain to compensate for the error.

In some techniques, delta-sigma patterns can be generated as the calibration stimulus to implement various techniques of this disclosure. A delta-sigma converter can be used to generate the pattern. Delta-sigma modulators can desirably push noise out of the frequency range of interest. The calibration techniques of this disclosure are not limited to use with delta-sigma patterns or delta-sigma modulators, however. In other examples, square wave or other patterns can be used.

It should be noted that although the calibration techniques of this disclosure were described above with respect to background calibration, the techniques are not limited to being performed in the background (background calibration). Rather, the calibration techniques of this disclosure can also be performed in the foreground (foreground calibration).

Variations and Implementations

Note that the activities discussed above with reference to the FIGURES are applicable to any integrated circuits that involve background calibration of DAC cells of a DAC. The techniques can be repeated by selecting certain DAC cell(s) to be the calibration DAC cell(s). The embodiments described herein can be used to background calibrate DACs having different architectures. Preferably, the embodiments can apply to a DAC whose independent elements or cells corresponding to controlling input bit lines directly sum at the output, like current-steering or potentially parallel capacitor DACs (which is really the majority of signal processing DACs). Other architectures like resistor string (precision applications) or pipeline capacitor DAC perform partial summation before the output is reached and are therefore not amenable to this method.

Performance of a DAC, i.e., measure of distortions at the output, is critical for some applications. The calibration scheme of the present disclosure provides a flexible and effective way for measuring error(s) in the background, i.e., while the main DAC is processing real time signals. In certain contexts, the features discussed herein can be applicable to medical systems, scientific instrumentation, wireless and wired communications, radar, industrial process control, audio and video equipment, current sensing, instrumentation (which can be highly precise), cable infrastructure, military (e.g., Radar), and other systems where reducing distortion at the output of a DAC is important to the application.

Parts of various apparatuses for background calibration DAC cells can include digital or electronic circuitry to perform the functions described herein. In some cases, one or more parts of the apparatus can be provided by a processor (e.g., an on-chip processor, an on-chip microprocessor, an on-chip digital signal processor, an off-chip processor, an off-chip microprocessor, and off-chip digital signal processor) specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer medium.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on-chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package. In various other embodiments, the calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure and/or examples. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the disclosure and/or examples. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to calibration, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the present disclosure. Note that all optional features of the apparatus described above may also be implemented with respect to the method or process described herein and specifics in the examples may be used anywhere in one or more embodiments.

EXAMPLES

Example 1. A method for measuring non-idealities of a DAC having a plurality of DAC cells and a plurality of redundant DAC cells whose outputs are summed to generate an analog output of the DAC, the method comprising: providing digital data to the DAC cells to generate an output spectrum at the analog output of the DAC; generating a first digitally-encoded calibration stimulus having a first fundamental energy at a first frequency bin; scaling the first digitally-encoded calibration stimulus by a first weighting factor, and providing a first weighted calibration stimulus to a first subset of the redundant DAC cells to generate a first analog tone while the DAC cells generate the output spectrum; scaling the first digitally-encoded calibration stimulus by a second weighting factor, and providing a second weighted calibration stimulus to a second subset of the redundant DAC cells to generate a second analog tone while the DAC cells generate the output spectrum, wherein the second weighting factor is selected to cause the first analog tone and the second analog tone to have opposite polarities; detecting, in the analog output of the DAC, an error tone at the first frequency bin resulting from the first analog tone and the second analog tone.

Example 2. The method of Example 1, wherein the digital data is shuffled to average out non-idealities of the DAC cells.

Example 3. The method of any one of the above Examples, wherein the DAC cells are shuffled to average out non-idealities of the DAC cells.

Example 4. The method of any one of the above Examples, wherein the redundant DAC cells comprise a bank of DAC cells having a least significant bit weight.

Example 5. The method of any one of the Examples 1-4, wherein the first subset of the redundant DAC cells comprises multiple redundant DAC cells, and the second subset of the redundant DAC cells comprises multiple redundant DAC cells.

Example 6. The method of any one of the Examples 1-4, wherein the first subset of the redundant DAC cells comprises a single redundant DAC cell, and the second subset of the redundant DAC cells comprises multiple redundant DAC cells.

Example 7. The method of any one of the Examples 1-4, wherein the first subset of the redundant DAC cells comprises multiple redundant DAC cells, and the second subset of the redundant DAC cells comprises a single redundant DAC cell.

Example 8. The method of any one of the Examples 1-4, wherein the first subset of the redundant DAC cells comprises a single redundant DAC cell, and the second subset of the redundant DAC cells comprises a single redundant DAC cell.

Example 9. The method of any one of the above Examples, wherein one or more redundant DAC cells are to receive a portion of the digital data, and a subset of the DAC cells become one or more redundant DAC cells to receive a weighted calibration stimulus.

Example 10. The method of any one of the above Examples, wherein the first weighting factor and the second weighting factor have opposite polarities.

Example 11. The method of any one of the above Examples, wherein the first weighting factor and the second weighting factor have a same magnitude.

Example 12. The method of any one of the above Examples, wherein the first weighting factor and the second weighting factor have different magnitudes.

Example 14. The method of any one of the above Examples, wherein the first weighting factor and the second weighting factor are selected from the following: +1, −1, a positive weight value, and a negative weight value.

Example 15. The method of any one of the above Examples, wherein summing the first analog tone and the second analog tone yields the error tone.

Example 16. The method of any one of the above Examples, wherein detecting the error tone comprises detecting energy in the analog output of the DAC at the first frequency bin.

Example 15. The method of any one of the above Examples, further comprising: iteratively minimizing the error tone by pre-distorting the digital data.

Example 16. The method of any one of the above Examples, further comprising: iteratively minimizing the error tone by adjusting the first subset of the redundant DAC cells or the second subset of the redundant DAC cells in the analog domain.

Example 17. The method of any one of the above Examples, wherein the first digitally-encoded calibration stimulus is a 1-bit sequence approximating a sine wave.

Example 18. The method of any one of the above Examples, wherein generating the first digitally-encoded calibration stimulus does not involve feedback.

Example 19. The method of any one of the above Examples, wherein generating the first digitally-encoded calibration stimulus comprises filtering a multi-bit sequence encoding a sinewave to generate a 1-bit sequence approximating the sinewave.

Example 20. The method of any one of the above Examples, wherein generating the first digitally-encoded calibration stimulus comprises low pass filter a multi-bit sequence encoding a sinewave.

Example 21. The method of any one of the above Examples, wherein the first frequency bin is not in-band with the output spectrum.

Example 22. The method of any one of the above Examples, wherein the first frequency bin is selected to not interfere with the output spectrum.

Example 23. The method of Example 1, further comprising: generating a second digitally-encoded calibration stimulus having a second fundamental energy at a second frequency bin, wherein the second frequency bin is different from the first frequency bin; scaling the second digitally-encoded calibration stimulus by a third weighting factor, and providing a third weighted calibration stimulus to a third subset of the redundant DAC cells to generate a third analog tone while the DAC cells generate the output spectrum; scaling the third digitally-encoded calibration stimulus by a fourth weighting factor, and providing a fourth weighted calibration stimulus to a fourth subset of the redundant DAC cells to generate a fourth analog tone while the DAC cells generate the output spectrum, wherein the fourth weighting factor is selected to cause the third analog tone and the fourth analog tone to have opposite polarities; detecting, in the analog output of the DAC, a further error tone resulting from the third analog tone and the fourth analog tone.

Example 24. The method of any one of the above Examples, wherein the DAC is a multi-gigabit per second DAC.

Example 25. The method of any one of the above Examples, wherein the non-idealities include static errors between DAC cells.

Example 26. The method of any one of the above Examples, wherein the non-idealities include timing errors between DAC cells.

Example 100. A method for measuring non-idealities of a DAC having a plurality of DAC cells and a plurality of redundant DAC cells whose outputs are summed to generate an analog output of the DAC, the method comprising: generating a first digitally-encoded calibration stimulus having a first fundamental energy at a first frequency bin; scaling the first digitally-encoded calibration stimulus by a first weighting factor to generate a first weighted calibration stimulus; providing the first weighted calibration stimulus to the redundant DAC cells to generate a first analog tone; providing digital data and an inverted version of the first weighted calibration stimulus to the DAC cells to generate an output spectrum and a second analog tone, while the first weighted calibration stimulus is provided to the redundant DAC cells; and detecting, in the analog output of the DAC, an error tone resulting from the first analog tone and the second analog tone.

Example 101. The method of Example 100, further comprising: generating a second digitally-encoded calibration stimulus having a second fundamental energy at a second frequency bin; scaling the second digitally-encoded calibration stimulus by a second weighting factor to generate a second weighted calibration stimulus; providing the second weighted calibration stimulus to further redundant DAC cells to generate a third analog tone; wherein an inverted version of the second weighted calibration stimulus is further provided to the DAC cells with the digital data and the inverted version of the first weighted calibration stimulus to further generate a fourth analog tone with the output spectrum and the second analog tone; and detecting, in the analog output of the DAC, a further error tone resulting from the third analog tone and the fourth analog tone.

Example 102. Any one of Examples 2-26 can be optional features to Example 100 or 101.

Example 200. A digital-to-analog converter (DAC) having calibration, comprising: a plurality of DAC cells to receive digital data and generate an output spectrum; a stimulus generator to generate a first digitally-encoded calibration stimulus having a first fundamental energy at a first frequency bin; one or more reference DAC cells to receive a weighted version of the first digitally-encoded calibration stimulus to generate a first analog tone; one or more calibration DAC cells to receive a further weighted version of the first digitally-encoded calibration stimulus to generate a second analog tone, wherein the second analog tone is of opposite polarity to the first analog tone; wherein outputs of the DAC cells, the reference DAC cells, and the calibration DAC cells are summed to form an analog output of the DAC; a sense ADC at the analog output of the DAC to sense an error tone resulting from the first analog tone and the second analog tone.

Example 201. The DAC having calibration of Example 200, further comprising: distortion logic to distort the digital data before the digital data is provided to the DAC cells.

Example 202. The DAC having calibration of Example 200 or 201, wherein the reference DAC cells and/or the calibration DAC cells are tunable in response to the sensed error tone.

Example 203. The DAC having calibration of any one of Examples 200-202, wherein the stimulus generator comprises a low pass filter to receive a multi-bit sinewave signal and generate a single-bit sequence approximating the sinewave.

Example 204. The DAC having calibration of any one of Examples 200-203, wherein the stimulus generator does not have feedback.

Example 205. The DAC having calibration of any one of Examples 200-204, further comprising: error extraction logic to measure energy at the first frequency bin.

Example 206. The DAC having calibration of any one of Examples 200-205 can implement any method of Examples 1-26.

Example 300. A digital-to-analog converter (DAC) having calibration, comprising: a stimulus generator to generate a first digitally-encoded calibration stimulus having a first fundamental energy at a first frequency bin; a plurality of DAC cells to receive digital data and a weighted version of the first digitally-encoded calibration stimulus, and to generate an output spectrum and a first analog tone at an analog output of the DAC; one or more calibration DAC cells to receive a further weighted version of the first digitally-encoded calibration stimulus to generate a second analog tone, wherein the second analog tone is of opposite polarity to the first analog tone; wherein outputs of the DAC cells and the calibration DAC cells are summed to form an analog output of the DAC; and a sense ADC at the analog output of the DAC to sense an error tone resulting from the first analog tone and the second analog tone.

Example 301. The DAC having calibration of Example 300, wherein: the stimulus generator is further to generate a second digitally-encoded calibration stimulus having a second fundamental energy at a second frequency bin different from the first frequency bin; the DAC cells are to further receive a weighted version of the second digitally-encoded calibration stimulus and to further generate a third analog tone at the analog output of the DAC; the DAC further comprises one or more further calibration DAC cells to receive a further weighted version of the second digitally-encoded calibration stimulus and to further generate a fourth analog tone; and the sense ADC to sense a further error tone resulting from the third analog tone and the fourth analog tone.

Example 302. The DAC having calibration of Examples 300 or Example 301 can implement any method of Examples 100-102.

The claimed invention is:

1. A method for measuring non-idealities of a DAC having a plurality of DAC cells and a plurality of redundant DAC cells whose outputs are summed to generate an analog output of the DAC, the method comprising:
   providing digital data to the DAC cells to generate an output spectrum at the analog output of the DAC;
   generating a first digitally-encoded calibration stimulus having a first fundamental energy at a first frequency bin;

scaling the first digitally-encoded calibration stimulus by a first weighting factor, and providing a first weighted calibration stimulus to a first subset of the redundant DAC cells to generate a first analog tone while the DAC cells generate the output spectrum;

scaling the first digitally-encoded calibration stimulus by a second weighting factor, and providing a second weighted calibration stimulus to a second subset of the redundant DAC cells to generate a second analog tone while the DAC cells generate the output spectrum, wherein the second weighting factor is selected to cause the first analog tone and the second analog tone to have opposite polarities; and detecting, in the analog output of the DAC, an error tone at the first frequency bin resulting from the first analog tone and the second analog tone.

2. The method of claim 1, wherein the digital data or the DAC cells are shuffled to average out non-idealities of the DAC cells.

3. The method of claim 1, wherein the first subset of the redundant DAC cells comprises multiple redundant DAC cells, and the second subset of the redundant DAC cells comprises multiple redundant DAC cells.

4. The method of claim 1, wherein the first subset of the redundant DAC cells comprises a single redundant DAC cell, and the second subset of the redundant DAC cells comprises multiple redundant DAC cells.

5. The method of claim 1, wherein the first subset of the redundant DAC cells comprises multiple redundant DAC cells, and the second subset of the redundant DAC cells comprises a single redundant DAC cell.

6. The method of claim 1, wherein the first subset of the redundant DAC cells comprises a single redundant DAC cell, and the second subset of the redundant DAC cells comprises a single redundant DAC cell.

7. The method of claim 1, wherein one or more redundant DAC cells are to receive a portion of the digital data, and a subset of the DAC cells become one or more redundant DAC cells to receive a weighted calibration stimulus.

8. The method of claim 1, wherein summing the first analog tone and the second analog tone yields the error tone.

9. The method of claim 1, wherein detecting the error tone comprises detecting energy in the analog output of the DAC at the first frequency bin.

10. The method of claim 1, further comprising:
iteratively minimizing the error tone by pre-distorting the digital data.

11. The method of claim 1, further comprising:
iteratively minimizing the error tone by adjusting the first subset of the redundant DAC cells or the second subset of the redundant DAC cells in the analog domain.

12. The method of claim 1, wherein the first digitally-encoded calibration stimulus is a 1-bit sequence approximating a sine wave.

13. The method of claim 1, wherein generating the first digitally-encoded calibration stimulus comprises filtering a multi-bit sequence encoding a sinewave to generate a 1-bit sequence approximating the sinewave.

14. The method of claim 1, wherein the method is performed as background calibration.

15. The method of claim 1, further comprising:
generating a second digitally-encoded calibration stimulus having a second fundamental energy at a second frequency bin, wherein the second frequency bin is different from the first frequency bin;
scaling the second digitally-encoded calibration stimulus by a third weighting factor, and providing a third weighted calibration stimulus to a third subset of the redundant DAC cells to generate a third analog tone while the DAC cells generate the output spectrum;
scaling the third digitally-encoded calibration stimulus by a fourth weighting factor, and providing a fourth weighted calibration stimulus to a fourth subset of the redundant DAC cells to generate a fourth analog tone while the DAC cells generate the output spectrum, wherein the fourth weighting factor is selected to cause the third analog tone and the fourth analog tone to have opposite polarities; and
detecting, in the analog output of the DAC, a further error tone resulting from the third analog tone and the fourth analog tone.

16. A method for measuring non-idealities of a DAC having a plurality of DAC cells and a plurality of redundant DAC cells whose outputs are summed to generate an analog output of the DAC, the method comprising:
generating a first digitally-encoded calibration stimulus having a first fundamental energy at a first frequency bin;
scaling the first digitally-encoded calibration stimulus by a first weighting factor to generate a first weighted calibration stimulus;
providing the first weighted calibration stimulus to the redundant DAC cells to generate a first analog tone;
providing digital data and an inverted version of the first weighted calibration stimulus to the DAC cells to generate an output spectrum and a second analog tone, while the first weighted calibration stimulus is provided to the redundant DAC cells; and
detecting, in the analog output of the DAC, an error tone resulting from the first analog tone and the second analog tone.

17. The method of claim 16, further comprising:
generating a second digitally-encoded calibration stimulus having a second fundamental energy at a second frequency bin;
scaling the second digitally-encoded calibration stimulus by a second weighting factor to generate a second weighted calibration stimulus;
providing the second weighted calibration stimulus to further redundant DAC cells to generate a third analog tone, wherein an inverted version of the second weighted calibration stimulus is further provided to the DAC cells with the digital data and the inverted version of the first weighted calibration stimulus to further generate a fourth analog tone with the output spectrum and the second analog tone; and
detecting, in the analog output of the DAC, a further error tone resulting from the third analog tone and the fourth analog tone.

18. A method for measuring one or both of static errors between DAC cells and timing errors between DAC cells of a multi-gigabit per second DAC having a plurality of DAC cells and a plurality of redundant DAC cells whose outputs are summed to generate an analog output of the DAC, the method comprising:
providing digital data to the DAC cells to generate an output spectrum at the analog output of the DAC;
generating a first digitally-encoded calibration stimulus having a first fundamental energy at a first frequency bin;
scaling the first digitally-encoded calibration stimulus by a first weighting factor, and providing a first weighted calibration stimulus to a first subset of the redundant DAC cells to generate a first analog tone while the DAC cells generate the output spectrum;

scaling the first digitally-encoded calibration stimulus by a second weighting factor, and providing a second weighted calibration stimulus to a second subset of the redundant DAC cells to generate a second analog tone while the DAC cells generate the output spectrum, wherein the second weighting factor is selected to cause the first analog tone and the second analog tone to have opposite polarities, wherein summing the first analog tone and the second analog tone yields the error tone; and detecting, in the analog output of the DAC, an error tone at the first frequency bin resulting from the first analog tone and the second analog tone by detecting energy in the analog output of the DAC at the first frequency bin.

19. The method of claim 18, further comprising:

iteratively minimizing the error tone by pre-distorting the digital data.

20. The method of claim 18, further comprising:

iteratively minimizing the error tone by adjusting the first subset of the redundant DAC cells or the second subset of the redundant DAC cells in the analog domain.

\* \* \* \* \*